United States Patent [19]
Dobos

[11] Patent Number: 4,795,923
[45] Date of Patent: Jan. 3, 1989

[54] ADJUSTABLE DELAY CIRCUIT
[75] Inventor: Laszlo J. Dobos, Beaverton, Oreg.
[73] Assignee: Tektronix, Inc., Beaverton, Oreg.
[21] Appl. No.: 125,022
[22] Filed: Nov. 25, 1987
[51] Int. Cl.$^4$ .......................... H03K 17/28; H03K 5/13
[52] U.S. Cl. .................................... 307/605; 307/608; 328/55
[58] Field of Search ................ 307/600, 601, 602, 605, 307/608, 603; 330/254, 278; 328/55, 56, 177

[56] References Cited
U.S. PATENT DOCUMENTS

| | | | |
|---|---|---|---|
| 2,981,892 | 4/1961 | Franks et al. | 328/177 |
| 3,100,875 | 8/1963 | Peterson | 328/55 |
| 3,668,532 | 6/1972 | Potash | 307/602 |
| 3,976,951 | 8/1976 | Ishigaki et al. | 330/254 |
| 4,216,435 | 8/1980 | Ahmed | 330/254 |
| 4,227,256 | 10/1980 | O'Keefe | 330/254 |
| 4,327,333 | 4/1982 | Wilcox | 330/254 |
| 4,344,044 | 8/1982 | Harford | 330/254 |
| 4,388,595 | 6/1983 | Brooks | 328/55 |
| 4,547,743 | 10/1985 | Goto | 330/254 |
| 4,675,562 | 6/1987 | Herlein et al. | 307/602 |

Primary Examiner—Stanley D. Miller
Assistant Examiner—Huy K. Mai
Attorney, Agent, or Firm—Daniel J. Bedell; Robert S. Hulse

[57] ABSTRACT

A delay element for producing an output signal in response to a change in state of an input signal includes variable gain first and second amplifiers and a delay buffer having a fixed delay. The input signal is applied as input to the first amplifier and the delay buffer while the output of the delay buffer is applied as input to the second amplifier. The outputs of the first and second amplifiers are summed to provide the output signal. When the gain of the first amplifier is high and the gain of the second amplifier is low, the output signal will respond to the change in state of the input signal with minimum delay. When the gain of the first amplifier is low and the gain of the second amplifier is high, the output signal will respond to the change in state of the input signal with maximum delay. The delay in change of state of the output signal in response to a change of state in the input signal may be adjusted with high resolution to a time intermediate between the minimum and maximum delays by adjusting the gains of the first and second amplifiers.

11 Claims, 3 Drawing Sheets

ADJUSTABLE DELAY CIRCUIT

BACKGROUND OF THE INVENTION

The present invention relates to delay circuits and particularly to variable delay circuits for high frequency signals.

Synchronous logic circuits require that logic signals to which they respond change state at times synchronized to a clock signal. It is sometimes necessary to provide means for adjustably delaying a logic signal prior to transmission to a synchronous logic circuit in order to synchronize that signal with other logic signals produced at locations more remote from the circuit, in order to account for differences in the paths that the signals follow. When a synchronous logic circuit is implemented in an integrated circuit, it is preferable for adjustable delay circuits used therewith to be implemented within the same integrated circuit in order to avoid the cost of additional discrete components.

Tapped delay lines have been used to delay logic signals but normally these cannot be implemented within an integrated circuit. A typical delay circuit implemented in integrated circuit form utilizes a cascade of logic gates, each successive gate delaying an input signal by the unit propagation time of a gate. The total delay provided by such a delay circuit is the product of the number of gates in cascade and the unit propagation time. The total delay can then be adjusted by switching logic gates in or out of the cascade. While such delay circuits are capable of adjusting signal delay over a wide range the delay resolution is limited to the propagation time of one logic gate. State changes in a data signal should occur within a narrow time window during each period of a synchronizing clock, and therefore such state changes must be synchronized with a resolution somewhat finer than the period of the clock. However, in a high speed synchronous logic circuit, the propagation time of logic gates may not be much less than the period of the clock signal controlling the circuit, and therefore delay circuits utilizing logic gate cascades may not be suitable.

SUMMARY OF THE INVENTION

In accordance with the invention, an adjustable delay circuit includes variable gain, first and second amplifiers, each producing an output current in response to an input voltage. The output currents of the two amplifiers are summed to produce a load current through a pair of resistors for providing a delay circuit output voltage. A voltage input signal to be delayed is applied as the input voltage to the first amplifier and as an input voltage to a buffer having a fixed signal propagation delay. The output of the buffer is supplied as the input voltage to the second amplifier.

A logic state change in the input signal causes a logic state change in the output current of the first amplifier after a relatively short delay, and a similar state change in the output current of the second amplifier after a relatively longer delay due to the delay of the intervening buffer. When the gain of the first amplifier is high and the gain of the second amplifier is low, the load current consists substantially of the output current of the first amplifier. Therefore the load current, as well as the output voltage of the delay circuit, change state (i.e., reach particular threshold logic levels) after only a minimum delay equal to the propagation time of the first amplifier. On the other hand, when the gain of the first amplifier is low and the gain of the second amplifier is high, the load current consists substantially of the output current of the second amplifier, and therefore the load current and the delay circuit output voltage change state after a maximum delay equal to the sum of the propagation times of the buffer and the second amplifier. The delay in the state change of the delay circuit output voltage with respect to a state change in the input signal can be adjusted with high resolution to a time intermediate between the minimum and maximum delays by adjusting the gains of the first and second amplifiers, e.g., by adjusting amplifier supply currents.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DRAWINGS

FIG. 1 is a schematic diagram of an adjustable delay circuit in accordance with the present invention; and FIGS. 2A through 2E and FIGS. 3A through 3E are timing diagrams illustrating the operation of the delay circuit of FIG. 1.

DETAILED DESCRIPTION

Figure 1:
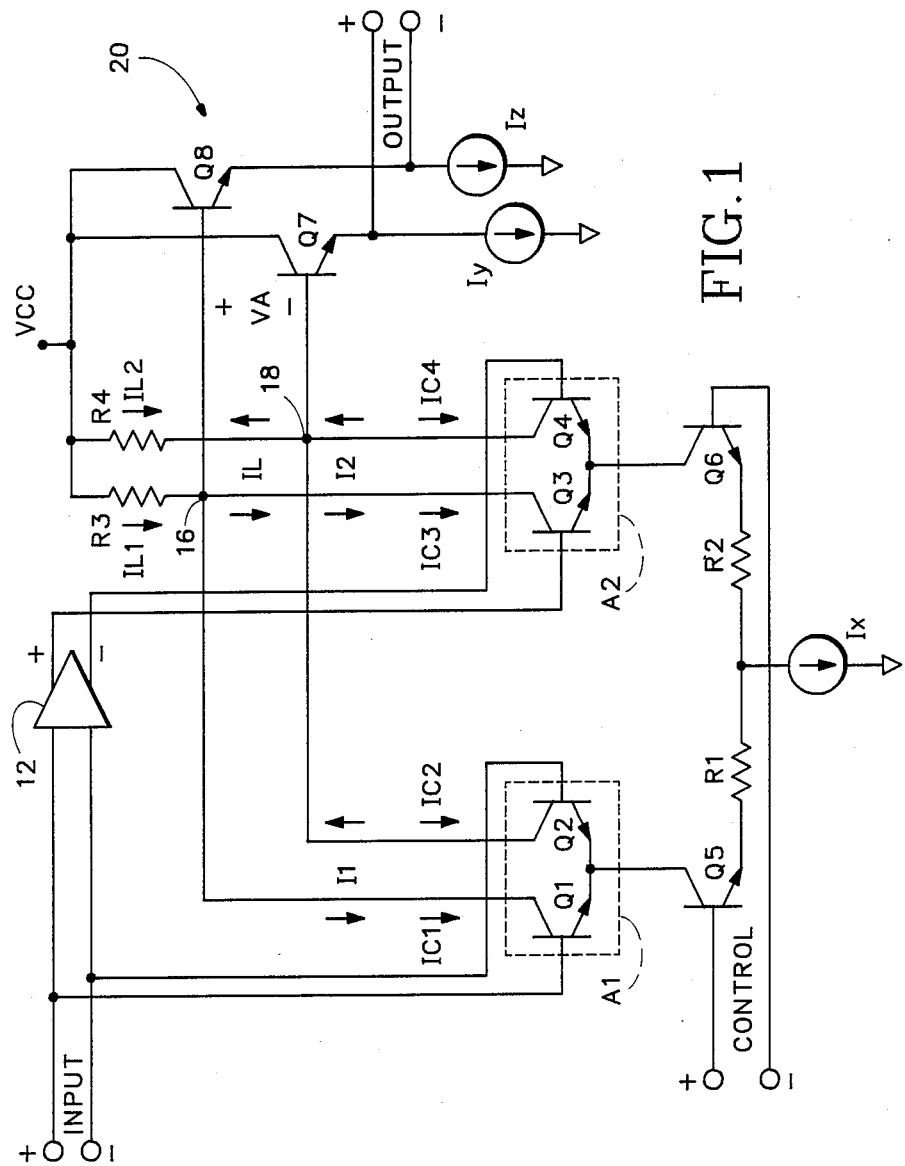

FIG. 1 is a schematic diagram of an adjustable delay circuit in accordance with the present invention, for receiving a differential INPUT signal and providing a differential OUTPUT signal, the OUTPUT signal being adjustably delayed with respect to the INPUT signal in accordance with the magnitude of a differential CONTROL signal.

The INPUT signal is applied across the bases of an emitter-coupled transistor pair Q1, Q2 and also as input to a buffer 12 having a fixed delay of FD seconds. The differential output of the buffer 12 is applied to the bases of a second emitter-coupled transistor pair Q3, Q4, while the CONTROL signal is coupled across the bases of a third transistor pair Q5, Q6. The emitters of transistors Q5 and Q6 are connected to a current source Ix through resistors R1 and R2, respectively. The emitters of transistor pair Q1, Q2 are connected to the collector of transistor Q5 while the emitters of transistor pair Q3, Q4 are tied to the collector of transistor Q6. Collectors of transistors Q1 and Q3 are interconnected at a node 16 which is coupled to voltage source Vcc by way of a resistor R3. Similarly, the collectors of transistors Q2 and Q4 are interconnected at a node 18, and node 18 is coupled to Vcc via resistor R4. Output stage 20 includes transistors Q7 and Q8 and matching current sources Iy and Iz. The base of transistor Q7 is coupled to node 18, the base of transistor Q8 is coupled to node 16, the collectors of transistors Q7 and Q8 are connected to Vcc, and the emitters are returned to ground via current sources Iy and Iz, respectively. The OUTPUT signal appears as a differential voltage across the emitters of transistor pair Q7, Q8.

Transistors Q1, Q2 form a differential amplifier A1 which amplifies the INPUT signal to provide a differential current output signal I1 = IC1 − IC2, where IC1 and IC2 are collector currents of transistors Q1 and Q2, respectively. Similarly, transistors Q3, Q4 form a second differential amplifier A2 amplifying the output of the fixed delay buffer 12 and supplying a differential current output signal I2=IC3−IC4, where IC3 and IC4 are collector currents of transistors Q3 and Q4, respectively. Currents IC1 and IC3 combine to form a load current IL1 through resistor R3 while currents IC2 and IC4 combine to form a load current IL2 through resistor R4. Thus, amplifiers A1 and A2 together provide a differential load current IL=IL1−IL2 through resistors R3 and R4.

The differential load current IL through matched resistor pair R3, R4 produces a differential voltage signal VA, across the node pair 16, 18 proportional to the differential load current signal IL. Output stage 20 comprises an emitterfollower amplifier that supplies the differential OUTPUT signal of substantially the same magnitude as its input signal VA.

As state change in the INPUT signal causes a state change in the output current I1 of the first amlifier A1 after a relatively short delay equal to the propagation time of the first amplifier. A state change in the INPUT signal also causes a similar state change in the output current I2 of second amplifier A2 after a relatively longer delay equal to the sum of the propagation times of buffer 12 and amlifier A2. When the gain of the first amplifier A1 is high and the gain of the second amplifier A2 is low, load current IL consists substantially of the output current I1 of the first amplifier, and therefore the load current and the OUTPUT signal of the delay circuit, change state (i.e., reach particular threshold logic levels) after only a minimum delay substantially equal to the propagation time of the first amplifier A1. On the other hand, when the gain of the first amplifier A1 is low and the gain of the second amplifier A2 is high, the load current IL consists substantially of the output current I2 of the second amplifier, and therefore the load current and the delay circuit OUTPUT signal change state after a maximum delay substantially equal to the sum of the propagation times of the buffer and the second amplifier. The CONTROL signal across the bases of transistor pair Q5, Q6 affects the relative proportion of current output of current source Ix that is transmitted, in the form of gain control currents, to the emitters of transistor pair Q1, Q2 and to the emitters of transistor pair Q3, Q4, and therefore may be said to control the gain of amplifiers A1 and A2. The delay in state change of laod current IL, and of the delay curcuit OUTPUT signal following a state change in the input signal, can be adjusted with high resolution to a time intermediate between the minimum and maximum delays by utilizing the CONTROL signal to adjust the amplifier gains.

A delay circuit utilizing three or more amplifiers and two or more delay buffers is described and claimed in the co-pending application of Einar O. Traa, Ser. No. 125,023, filed concurrently herewith and also entitled ADJUSTABLE DELAY CIRCUIT. Portions of the subject matter of the present application are also in the co-pending application of Hans-Jurg Greub, Ser. No. 084,003, filed Aug. 7, 1987, entitled HIGH SPEED, PARTITIONED REDUCED INSTRUCTION SET COMPUTER.

Figure 2A:
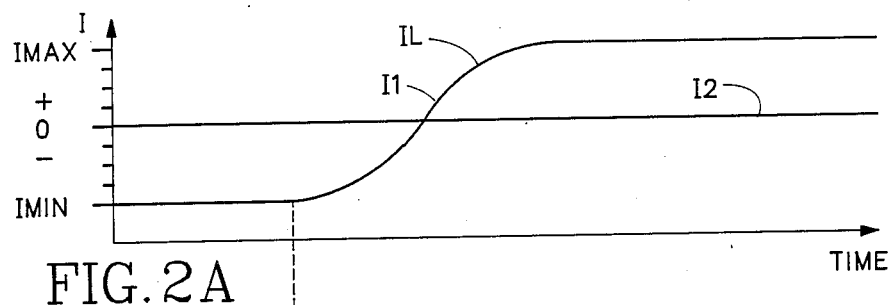

FIG. 2A illustrates relationships between IL, I1 and I2 when the CONTROL signal is large and positive. Referring to FIGS. 1 and 2A, when the CONTROL signal is large and positive transistor Q5 is on and transistor Q6 is off, and substantially all of the current output of current source Ix is transmitted through transistor Q5 to the amplifier A1 and virtually no current is transmitted to amplifier A2. In such case, output signal I1 of the amplifier A1 varies between a minimum value IMIN and a positive value IMAX when the INPUT signal changes state, while the output signal I2 of the amplifier A2 remains at substantially zero. Thus, for a large, positive CONTROL signal, the load current signal IL follows the output signal I1 of the amplifier A1, and the amplifier A2 contributes nothing to the load signal IA.

Figure 2B:
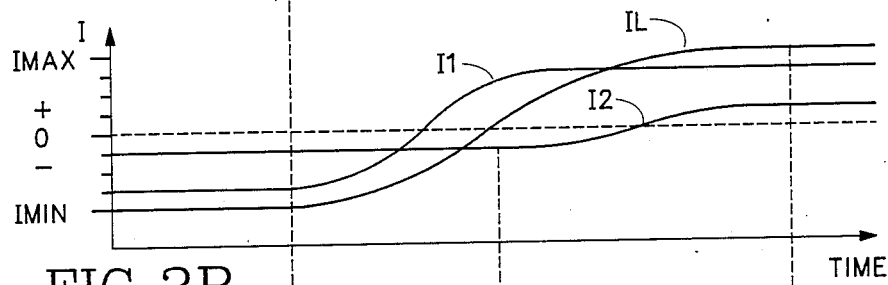
Figure 2C:
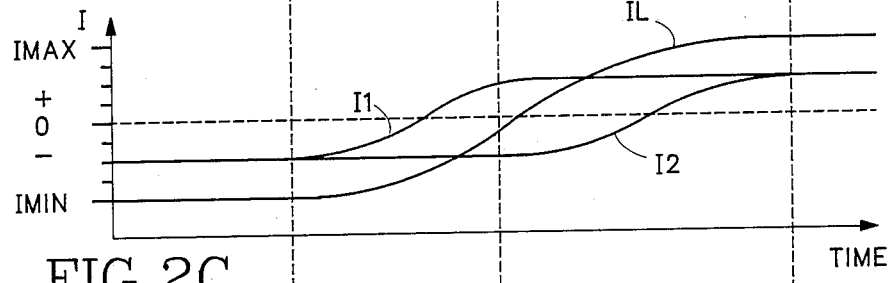
Figure 2D:
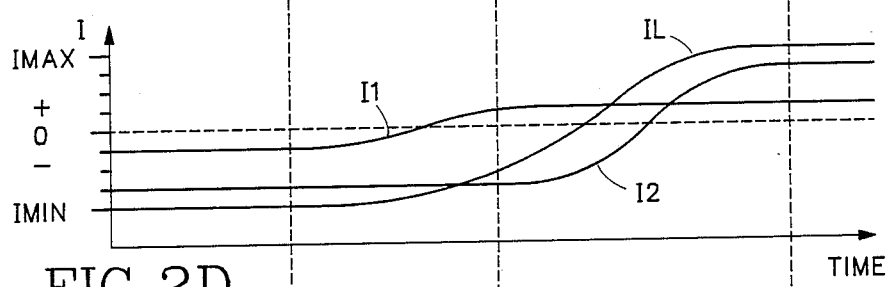
Figure 2E:
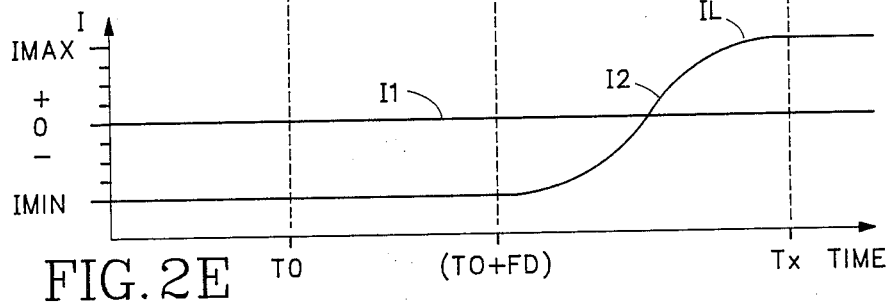

FIG. 2E illustrates relationships between IL, I1 and I2 when the CONTROL signal is large and negative. Referring to FIGS. 1 and 2E, when the CONTROL signal is large and negative, transistor Q6 is on and transistor Q5 is off, and therefore substantially all of the current output of the current source Ix is transmitted through the transistor Q6 to the amplifier A2 and virtually no current is delivered to the amplifier A1. In this case the output signal I2 of the amplifier varies between IMIN and IMAX as the INPUT signal changes state, while the output signal I1 of the amplifier A1 remains at substantially zero amps. Thus, for a large negative CONTROL signal, the load current signal IL follows the output signal I2 of the amplifier A2, and amplifier A1 contributes nothing to the load signal IL.

FIGS. 2B through 2D illustrates operation of the delay circuit at intermediate CONTROL signal values, i.e., between the aforementioned positive and negative extremes. The CONTROL signal apportions or divides the current output of current source Ix between the amplifiers A1 and A2 so as to control the gain of each amplifier. As the INPUT signal changes from state-to-state, while the CONTROL signal is at an intermediate value, the output signals I1 and I2 of amplifiers A1 and A2 vary over ranges that are less than IMAX-IMIN although load current IL which is the sum of I1 and I2 always varies over the full range of IMAX-IMIN.

FIG. 2B depicts a case where the CONTROL signal is such that 75% of the current output of the current source Ix is directed through the amplifier A1 and 25% is directed through the amplifier A2. As a result, the output current I1 of the amplifier A1 varies between 75% of IMIN and 75% of IMAX and the output current I2 of the amplifier A2 varies between 25% of IMIN and 25% of IMAX. The load current signal IL, being the sum of signals I1 and I2, then varies between IMIN and IMAX.

FIG. 2C shows I1, I2 and IL when the CONTROL signal causes 50% of the current output of the current source Ix to be directed through the amplifier A1 and 50% to be directed through the amplifier A2. The output signal I1 of the amplifier A1 then varies between 50% of IMIN and 50% of IMAX and the output signal I2 of the amplifier A2 varies between 50% of IMIN and 50% of IMAX.

FIG. 2D illustrates I1, I2 and IL when the CONTROL signal directs 25% of the current output of the current source Ix through the amplifier A1 and 75% through the amplifier A2. As a result, the output signal I1 of the amplifier A1 varies between 25% of IMIN and 25% of IMAX and the output signal I2 of the amplifier A2 varies between 75% of IMIN and 75% of IMAX. Again, the load signal IL varies between IMIN and IMAX.

In comparing the FIGS. 2A–2E, it may be appreciated that the shape of the load current signal IL is affected by the value of the CONTROL signal. In each of the FIGS. 2A–2E, the INPUT signal changes state at a time T0, in this case, a negative-to-positive or rising edge transition. The signal I1 of the amplifier A1 begins its response to the INPUT signal state transition at time T0 while the signal I2 of the amplifier A2 begins its response to the transition in the INPUT signal at a later time (T0 FD), after the INPUT signal has been delayed FD seconds by the fixed delay buffer 12. When the CONTROL signal is large and positive, as in FIG. 2A, the load current signal IL rises quickly after the time T0. When the CONTROL signal is large and negative, as in FIG. 2E, the load current signal IL rises just as quickly but starts at a later time (T0 FD). At intermediate CONTROL signal values, as in FIGS. 2B–2D, the load current signal IL begins to rise at the time T0 when I1 begins to rise, but does not complete its rise until a time Tx, when the signal I2 has completed its rise. Thus, for intermediate CONTROL signal values, the shape of the load current signal IL is "stretched out" between the times T0 and Tx as it goes from IMIN to IMAX. Further, it may be observed that if the amplifier A1 dominates production of the load signal IL as in FIG. 2B, the load signal IL is steep at the beginning of its swing from IMIN to IMAX and flatter toward the end of its swing. Conversely, if the amplifier A2 dominates production of the load signal IL, as in FIG. 2D, the load signal IL is relatively flat at the beginning of its swing and steeper at the end of its swing. In FIG. 2C, where amplifiers A1 and A2 contribute equally to production of the load signal IL, the load signal IL rises rapidly during the middle of its swing and less rapidly at the beginning and end of its swing from IMIN to IMAX.

Variations in load current signal IL between the values IMIN and IMAX produce corresponding variations in the differential voltage signal VA between voltages VMIN and VMAX. The emitter-follower output stage 20 amplifies the signal VA with unity gain to supply the delay circuit OUTPUT voltage signal. Since the value of the CONTROL signal affects the shape of the load current signal IL, the shape of the signal VA and the OUTPUT signal are similarly affected. A differential voltage threshold, between VMIN and VMAX, may be taken as a cross-over point at which the OUTPUT signal changes from a first logic state to a second logic state. An external circuit receiving the OUTPUT signal suitably interprets OUTPUT as, for example, a logic 0 level for voltages below the threshold and a logic 1 level for voltages above the threshold. Because the CONTROL signal may be used to cause OUTPUT to rise early or to rise late in response to a transition in the INPUT signal, the CONTROL signal determines when the OUTPUT signal crosses the threshold and, accordingly, when the OUTPUT signal passes from logic 0 to logic 1.

FIGS. 3A through 3E plot the rise of the OUTPUT signal from VMIN to VMAX for various CONTROL signal values and indicate the delay provided between the rising edge of the INPUT signal at the time T0 and the corresponding transition of the OUTPUT signal from below a differential voltage threshold VTH to above the threshold VTH. FIGS. 3A through 3E correspond to FIGS. 2A through 2E, respectively, in accordance with the value of the CONTROL signal.

Figure 3A:
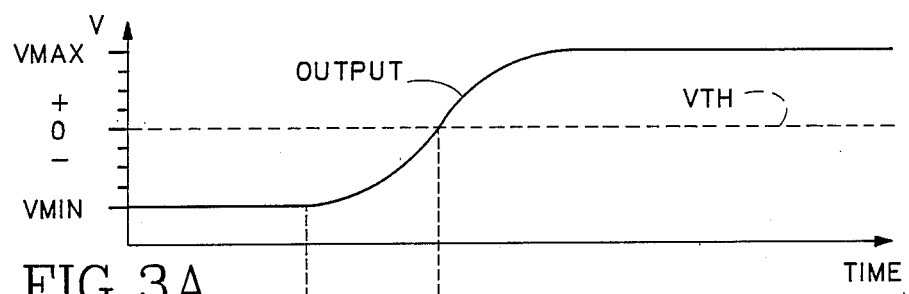
Figure 3B:
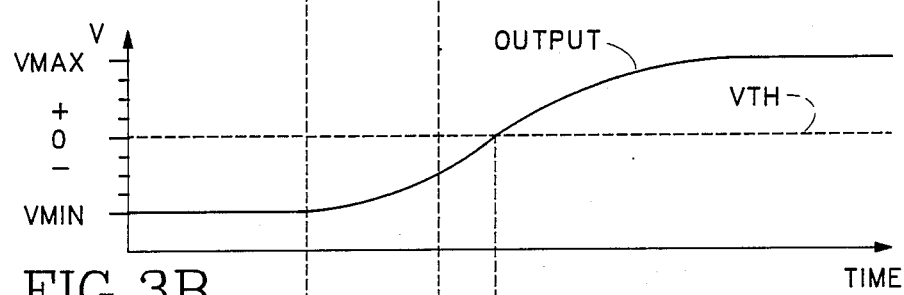
Figure 3C:
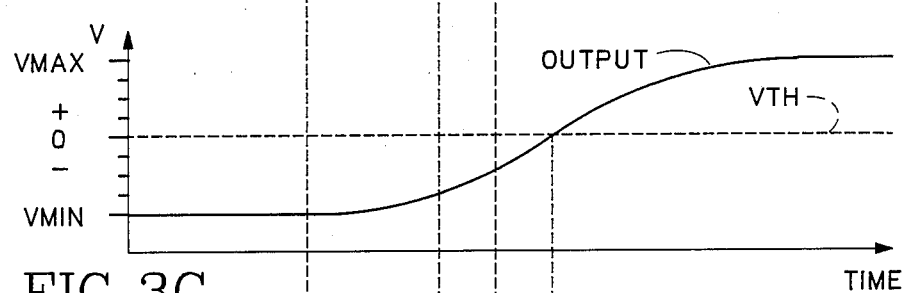
Figure 3D:
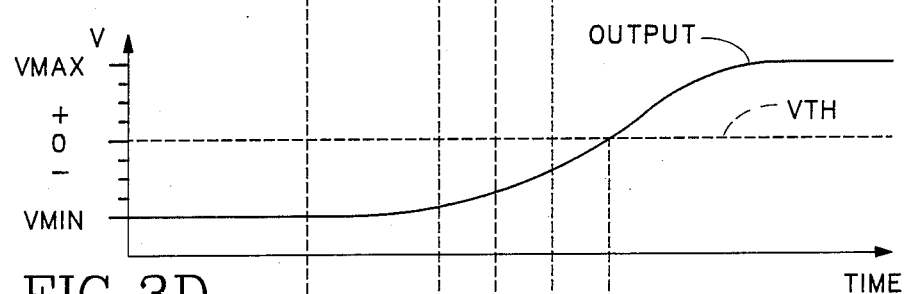
Figure 3E:
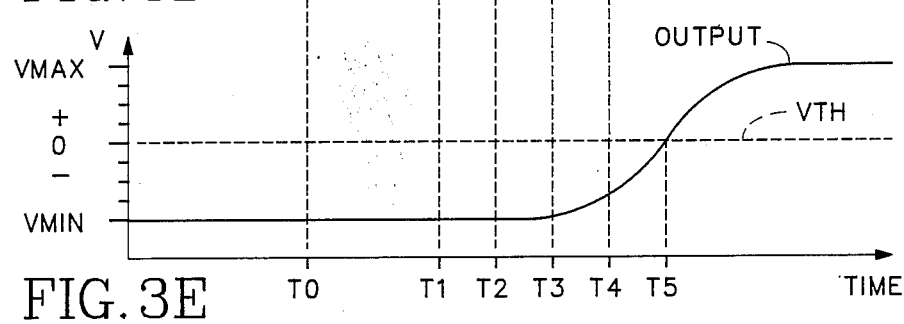

With reference to FIGS. 1, 2A and 3A, when the CONTROL signal is large and positive, load signal IL initially rises sharply in response to the rising edge of the INPUT signal at the time T0. The OUTPUT signal, being directly proportional to the load signal IL, also rises sharply shortly after time T0 and crosses the threshold VTH at a time T1. With reference to FIGS. 1, 2B and 3B, when the CONTROL signal directs 75% of the current output of the current source Ix to the amplifier A1 and 25% to the amplifier A2, the load signal IL rises sharply some time after beginning its response and flattens out toward the end of its response. The OUTPUT signal, being proportional to IL, crosses the threshold VTH at a time T2 later than T1. Again with reference to FIGS. 1, 2C and 3C, when the CONTROL signal causes 50% of the current output of the current source Ix to be directed to the amplifier A1 and 50% to be directed to the amplifier A2, the load signal IL causes the OUTPUT signal to cross the threshold VTH at a time T3 later than T2. FIGS. 2D and 3D illustrate the case where the CONTROL signal directs 25% of the current output of the current source Ix through the amplifier A1 and 75% through the amplifier A2. The load signal IL and the OUTPUT signal rise slowly in the beginning of their response and sharply toward the end of their response, so that the OUTPUT signal crosses the threshold VTH at a time T4 later than T3. Finally, with reference to FIGS. 2E and 3E the CONTROL signal is large and negative and causes the load signal IL and OUTPUT signal to begin to rise very sharply at the relatively late time (T0+FD). The OUTPUT signal crosses the threshold VTH at a time T5 later than T4.

FIGS. 2A–2E and 3A–3E illustrate circuit behavior when the INPUT signal changes from negative to positive. In the case of a positive-to-negative or falling edge transition in the INPUT signal, the OUTPUT signal makes a transition from VMAX to VMIN wherein the CONTROL signal determines whether the OUTPUT signal falls early or falls late in its response to the falling edge of the INPUT signal. The delay between the falling edge of the INPUT signal and the transition of the OUTPUT signal from above the threshold VTH to below the threshold VTH corresponds to those delay times between the rising edge of the INPUT signal and the transition of the OUTPUT signal from below the threshold VTH to above the threshold VTH. For example, if the CONTROL signal is such that approximately 75% of the current output of current source Ix is directed through amplifier A1 and approximately 25% is directed through the amplifier A2, as is the case of FIGS. 2B and 3B, then a delay time of T2−T0 will transpire between the falling edge of the INPUT signal and the time at which OUTPUT passes from above VTH to below VTH.

In reference to FIGS. 1, 2A–2E, and 3A–3E, the IL signal should make a continuously increasing transition between IMIN and IMAX to establish a continuous range of available delay times and avoid an ambiguous condition where the OUTPUT signal remains for a time at or near the threshold voltage VTH. To insure a continuously increasing transition in the IL signal between IMIN and IMAX, the amplifier A1 should not complete its response to a state change in the INPUT signal until after the amplifier A2 has begun its response to the state change in the INPUT signal. If the amplifier A1 were to complete its response before the amplifier A2 began its response, the IL signal would follow the output I1 of amplifier A1 to an intermediate level between IMIN and IMAX and remain at that intermediate level until amplifier A2 began its response. In such case, the OUTPUT signal rises rapidly during the response of the amplifier A1 and during the response of the amplifier A2, but rises very slowly during an intervening period. Further, if the OUTPUT signal were near the threshold VTH during the intervening period, the OUTPUT signal could cross VTH at any time during that period due to noise in the circuit and the "delay time" of the circuit would be unpredictable. Thus, the signal propagation time of the amplifier A1 should be greater than FD seconds, the signal propagation time of the fixed delay buffer 12, so that the amplifier A2 can begin its response before the amplifier A1 completes its response. Additionally, the signal propagation time of the fixed delay buffer 12, FD seconds, should be less than the rise time of the INPUT signal. As used herein, the "signal propagation time" of a device may be taken as the rise time of the device from 10% of its output to 90% of its output.

While the INPUT signal and OUTPUT signal state changes have been shown as negative to positive or positive to negative, it is understood that high and low logic levels represented by positive and negative voltages, respectively, are presented for illustration and are not essential to proper operation of the described circuit. For example, positive change in state of the INPUT signal from a first logic level represented by a first voltage to a second logic level represented by a second positive voltage is reflected, after a given delay, in the OUTPUT signal as a change in state from a third positive voltage to a fourth positive voltage. A circuit interpreting the OUTPUT signal may take a threshold voltage between the third and fourth positive voltage in order to detect a transition between logic 1 and logic 0, there is no requirement that the threshold differential be a zero voltage differential.

Thus, it may be seen that by adjusting the CONTROL signal, the time at which the OUTPUT signal changes state (i.e., crosses Vth) in response to a change in state of the INPUT signal at T0 can be adjusted to any value between T1 and T5. Accordingly, the delay between a change in state of the INPUT and OUTPUT signals can be adjusted with a high degree of resolution limited only by the resolution with which the CONTROL signal may be adjusted. The delay circuit of the present invention requires few passive circuit elements, only four resistors and no capacitors, and may therefore be efficiently incorporated into an integrated circuit without requiring excessive circuit area.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim

1. A method of producing an output signal that changes state in adjustably delayed response to a state change in an input signal, the method comprising the steps of:
    delaying the input signal to provide a delayed signal;
    applying the input signal as input to a first amplifier having an adjustable gain to provide a first signal in response to said input signal;
    applying the delayed signal as input to a second amplifier having an adjustable gain to provide a second signal in response to said delayed signal; and
    combining the first and second signals to produce said output signal; and
    adjusting a delay between said change in state of said output signal and said change in state of said input signal by adjusting the gain of at least one of said first and second amplifiers.

2. A method according to claim 1, wherein the step of adjusting a delay comprises:
    adjusting the gain of the first amplifier; and
    adjusting the gain of the second amplifier,
    while holding constant a sum of the gain of the first amplifier and the gain of the second amplifier.

3. A method according to claim 1, wherein the step of combining the first and second signals comprises the step of summing the first and second signals.

4. A method according to claim 1, wherein the step of delaying the input signal comprises the step of delaying the input signal by a fixed amount of time to provide said delayed signal.

5. A delay circuit for producing an output signal that changes state in adjustably delayed response to a change in state of an input signal, the delay circuit comprising:
    means for providing a delayed signal that changes state in delayed response to a change in state of said input signal;
    first amplification means having adjustable first gain for receiving the input signal and for providing a first signal in response to said input signal;
    second amplification means having adjustable second gain for receiving the delayed signal and for providing a second signal in response to said delayed signal;
    means for combining the first and second signals to provide the output signal; and
    means for adjusting at least one of said first and second gains.

6. A delay circuit according to claim 5, wherein said combining means sums the first and second signals.

7. A delay circuit according to claim 5, wherein the response of said means for providing a delayed signal is delayed by a fixed amount of time.

8. A delay circuit according to claim 5, wherein said first amplification means has a first signal propagation time, said means for providing a delayed signal has a second signal propagation time, and the first signal propagation time is greater than the second signal propagation time.

9. A delay circuit for producing an output signal that changes state in adjustably delayed response to a change in state of a differential input signal, the delay circuit comprising:
    means for providing a differential delayed signal that changes state in delayed response to a change in state of said input signal;
    a first transistor having a first terminal, a second terminal, and a third terminal;
    a second transistor having a first terminal, a second terminal, and a third terminal wherein the input signal is applied across the first terminal of the first transistor and the first terminal of the second transistor, the second terminal of the first transistor is coupled to the second terminal of the second transistor, and a first differential current signal is provided at the third terminal of the first transistor and the third terminal of the second transistor;
    a third transistor having a first terminal, a second terminal, and a third terminal;
    a fourth transistor having a first terminal, a second terminal, and a third terminal wherein the delayed signal is applied across the first terminal of the third transistor and the first terminal of the fourth transistor, the second terminal of the third transistor is coupled to the second terminal of the fourth transistor, and a second differential current signal is provided at the third terminal of the third transistor and the third terminal of the fourth transistor;

means for providing an adjustable first gain control current and an adjustable second gain control current, the first gain control current being applied at the second terminal of the first transistor and the second terminal of the second transistor, the second gain control current being applied at the second terminal of the third transistor and the second terminal of the fourth transistor; and means for combining the first and second differential signals to provide the output signal.

10. A delay circuit according to claim 9, wherein said means for providing an adjustable first gain control current and an adjustable second gain control current comprises:

a current source for providing a source current; and means for adjustably dividing the source between the first gain control current and the second gain control current in accordance with a control signal.

11. A delay circuit according to claim 10, wherein the control signal is a differential voltage signal and the means for adjustably dividing the source current comprises:

a first resistor;

a second resistor;

a fifth transistor having a first terminal, a second terminal coupled to the current source through the first resistor, and a third terminal for providing the first gain control current; and a sixth transistor having a first terminal, a second terminal coupled to the current source through the second resistor, and a third terminal for providing the second gain control current, wherein the control signal is applied across the first terminal of the fifth transistor and the first terminal of the sixth transistor.

* * * * *